United States Patent [19]

Embree

[11] 4,412,184

[45] Oct. 25, 1983

[54] PRECISION ISOLATION AMPLIFIER

[75] Inventor: Milton L. Embree, Reading, Pa.

[73] Assignee: Bell Telephone Laboratories, Incorporated, Murray Hill, N.J.

[21] Appl. No.: 295,691

[22] Filed: Aug. 24, 1981

[51] Int. Cl.³ .............................................. H03F 3/45
[52] U.S. Cl. ...................................... 330/69; 330/261
[58] Field of Search ................. 330/69, 261, 295, 252; 179/1 A, 16 EA

[56] References Cited

U.S. PATENT DOCUMENTS

| | | | |
|---|---|---|---|
| 4,146,844 | 3/1979 | Quinn | 330/69 |
| 4,206,416 | 6/1980 | Kellogg | 330/69 |

*Primary Examiner*—James B. Mullins
*Assistant Examiner*—Gene Wan
*Attorney, Agent, or Firm*—J. M. Graziano

[57] ABSTRACT

The subject precision isolation amplifier adds error correction circuitry to a basic isolation amplifier circuit to thereby produce an error-free output signal comprising only the metallic component of the monitored voltages. The error correction circuit consists of a pair of up/down emitter followers and a current mirror circuit which function to eliminate both the longitudinal components of the monitored voltage signals and the voltage offset generated by the basic isolation amplifier. A second error-free ouput signal comprising only the longitudinal component of the monitored voltage signals is also provided.

5 Claims, 1 Drawing Figure

PRECISION ISOLATION AMPLIFIER

FIELD OF THE INVENTION

This invention relates to instrumentation amplifiers and, in particular, to a precision isolation amplifier which generates signals which accurately represent both the longitudinal and metallic components of the monitored voltage signals.

BACKGROUND OF THE INVENTION

Instrumentation amplifier circuits are well-known in the art and are typically used to monitor the voltage signals which appear on a pair of conductors. The instrumentation amplifier outputs a voltage which represents the difference of the voltage signals appearing on the monitored conductors. The subject precision isolation amplifier performs this function by adding error correction circuitry to a basic isolation amplifier circuit to thereby produce two error-free output signals. The first of these output signals is proportional to only the longitudinal variation of the monitored conductors and is equal to one half the sum of the voltage signals appearing on those conductors. The second output signal is proportional to only the metallic signal appearing on those conductors and is proportional to the difference of the voltage signals appearing thereon.

The error correction circuit consists of a pair of up/down emitter followers and a current mirror circuit which function to selectively eliminate both the longitudinal components of the monitored voltage signals and the voltage offset generated by the basic isolation amplifier to thereby produce the aformentioned output signals in error-free fashion.

DETAILED DESCRIPTION OF THE DRAWING

Figure 1:
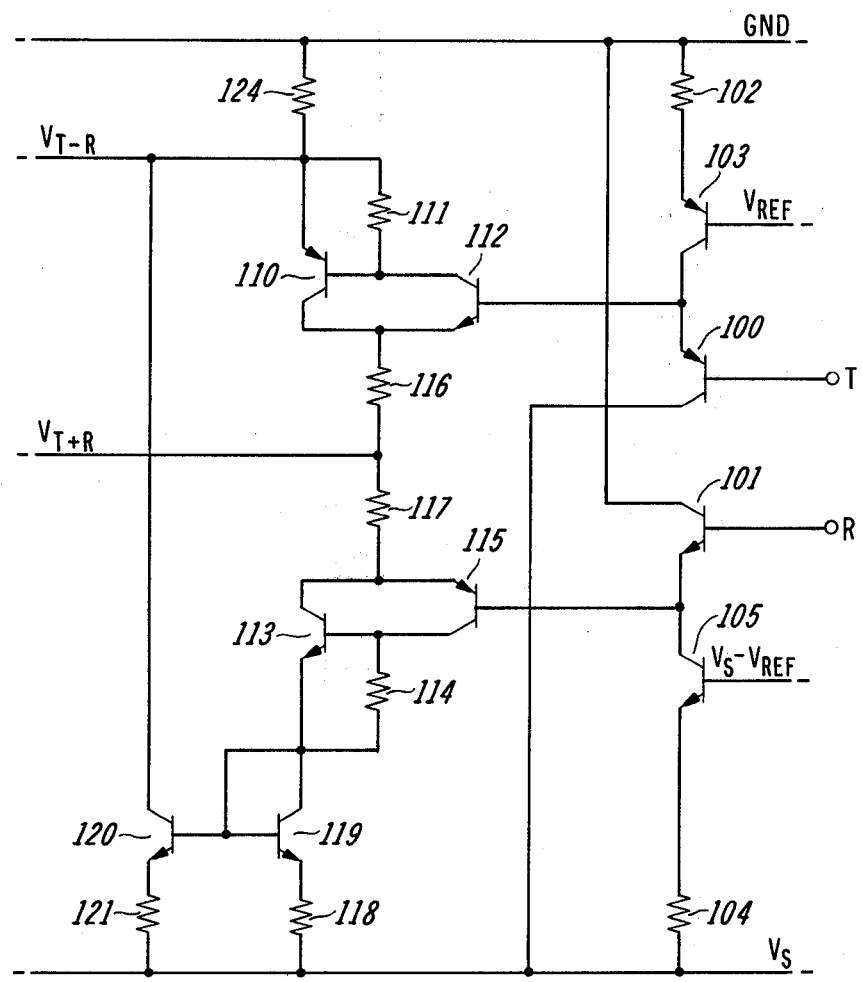
FIG. 1 illustrates the precision isolation amplifier circuit of the invention.

The subject precision isolation amplifier circuit is illustrated in FIG. 1 wherein the amplifier input terminals are connected to a communication pair, leads T and R, which leads have voltage signals ($V_T$ and $V_R$) on them which must be monitored. The amplifier output terminals are connected to both lead $V_{T+R}$ and lead $V_{T-R}$. The output signals appearing on leads $V_{T+R}$ and $V_{T-R}$ respectively represent the average of the voltage signals appearing on leads T and R and the difference of the voltage signals appearing on leads T and R. As is evidenced from the drawing, the subject precision isolation amplifier circuit is substantially symmetrical about a center line drawn horizontally across FIG. 1 from lead $V_{T+R}$ to the mid-point between the input leads T and R. To simplify the description of this circuit, only one portion of the symmetric circuitry will be described.

To begin the description of this circuit it is advantageous to discuss the up/down emitter follower circuit consisting of elements 100, 110–112. Transistors 110 and 112 comprise a well-known composite transistor configuration which, with bias resistor 111, evidences the characteristics of high current gain and high input impedance. Thus, only a small input current is required to activate this circuit and to produce a high current output, thereby minimizing the load on the input signal source. It is also significant to note that the voltage at the emitter of transistor 112 is equal to the voltage at the base of transistor 112 less the base-emitter voltage drop ($V_{BE112}$) of transistor 112. It is apparent from FIG. 1 that by inserting transistor 100 and by making the base-emitter drops of transistor 100 ($V_{BE100}$) and 112 ($V_{BE112}$) identical, the voltage appearing on lead T ($V_T$) will be identically reproduced at the emitter of transistor 112. This base-emitter matching is easily accomplished by the appropriate controls over the manufacture of these transistors (110, 112) or by careful selection and testing of the transistors used to implement this circuit. In addition, the input impedance seen at the base of transistor 100 is beta times the input impedance seen at the base of transistor 112. The input impedance of the precision isolation amplifier will therefore be very high since the up/down emitter follower circuit, as was mentioned above, already has a very high input impedance.

To insure the consistency of operation of the circuit over a wide range of input signals, the operating characteristics of transistor 100 are stabilized by supplying transistor 100 with a constant current by way of the constant current source comprising resistor 102, transistor 103 and the voltage source $V_{REF}$. Therefore, any voltage signal $V_T$ appearing on lead T will be applied to the very high input impedance of the base of transistor 100 and this voltage signal will be replicated at the emitter of transistor 112. Due to the obvious symmetry of this circuit, an identical situation exists for lead R and the voltage appearing thereon ($V_R$) will appear on the emitter of transistor 115.

As evidenced from the structure of resistors 116 and 117, the voltage appearing at the junction of these two elements will be one-half the sum of the voltages appearing on leads T and R ($V_T$, $V_R$) if the value of these two resistors are identical. One source of error in this configuration is that any load placed on the output of the precision isolation amplifier (lead $V_{T+R}$) will draw current through resistor 116, therefore unbalancing this configuration. To eliminate the affect of this imbalance, the current mirror comprised of elements 118–121 supplies an error correcting signal current to the circuit load resistor 124 to thereby return balance to this circuit.

In addition to the sum signal output on lead $V_{T+R}$, a difference signal is produced at the output lead $V_{T-R}$. This is accomplished by the impedance provided by the sum resistors 116, 117 causing a current to flow between the emitter terminals of transistors 112 and 115. This difference current ($I_D$) is equal to the difference ($V_T - V_R$) between the voltage appearing on the emitters of transistors 112 and 115 divided by the impedance of resistors 116 and 117. It is obvious that this difference current $I_D$ is proportional to the metallic voltage signal ($V_T - V_R$) appearing on leads T and R. This difference current is also reflected by current mirror elements 118–121 to be drawn through resistor 118 and via the up/down emitter follower (110–112) to also be drawn through resistor 124. Thus, the current through resistor 124 is also proportional to the metallic voltage signal $V_T - V_R$ and, with the appropriate selection of the value of resistor 124, the voltage appearing on output lead $V_{T-R}$ is equal to the difference voltage $V_T - V_R$. It is significant to note that the $V_{T-R}$ output of the precision isolation amplifier is a function of the longitudinal voltages appearing on leads T and R unless the entire circuit is balanced and this has been a predominant problem with prior art instrumentation amplifiers. As can be seen from the above description, the subject circuit has been configured to be balanced to a high degree of accuracy thereby eliminating the source of error in the output signal.

While a specific embodiment of the invention has been disclosed, variations in structural detail, within the scope of the appended claims, are possible and are contemplated. There is no intention of limitation to what is contained in the abstract or the exact disclosure as herein presented. The above-described arrangements are only illustrative of the application of the principles of the invention. Normally, other arrangements may be devised by those skilled in the art without departing from the spirit and scope of the invention.

What is claimed is:

1. A precision isolation amplifier circuit having a pair of input terminals (T, R) and an output terminal ($V_{T+R}$), for producing an output signal on said output terminal ($V_{T+R}$) representing the average of the input signals ($V_T$, $V_R$) appearing on said pair of input terminals (T, R) comprising:

first (100, 102, 103) and second (101, 104, 105) input means connected respectively to said first (T) and said second (R) input terminal and responsive to a first ($V_T$) and a second ($V_R$) voltage signal appearing on said first (T) and said second (R) input terminals respectively for generating a first ($V_T+V_{BE100}$) and a second ($V_R+V_{BE101}$) drive signal which respectively comprise said first voltage signal ($V_T$) plus a first offset signal ($V_{BE100}$) which is independent of said first voltage signal and said second voltage signal ($V_R$) plus a second offset signal ($V_{BE101}$) which is independent of said second voltage signal;

first (110-112) and second (113-115) up/down emitter follower means connected to said first (100, 102, 103) and said second (101, 104, 105) input means respectively for generating the inverse of said first offset signal ($V_{BE100}$) and said second offset signal ($V_{BE101}$) respectively;

wherein said first (110-112) and said second (113-115) up/down emitter follower means are responsive to said first ($V_T+V_{BE100}$) and said second ($V_R+V_{BE101}$) drive signals respectively for combining said generated inverse first ($V_{BE100}$) and second ($V_{BE101}$) offset signals respectively with said first and said second drive signals to output said first ($V_T$) and said second ($V_R$) voltage signals respectively; and sum means (116, 117) connected to both said first (110-112) and said second (113-115) up/down emitter follower means and responsive to said first ($V_T$) and said second ($V_R$) voltage signals output therefrom for generating said output signal on said output terminal ($V_{T+R}$) representing the average of said first ($V_T$) and said second ($V_R$) voltage signals.

2. The invention of claim 1 wherein said sum means (116, 117) includes first (116) and second (117) resistor means of equal impedance, each having one terminal which is connected respectively to said first (110-112) and said second (113-115) up/down emitter follower means and each having the other terminal connected to said output terminal ($V_{T+R}$) for summing said first ($V_T$) and said second ($V_R$) voltage signals output by said first (110-112) and said second (113-115) up/down emitter follower means respectively.

3. The invention of claim 1 wherein said first (100) and said second (101) input amplifier means comprise unity gain voltage amplifier means responsive to said first ($V_T$) and said second ($V_R$) voltage signals respectively for outputting said first ($V_T$) and said second ($V_R$) voltage signals respectively plus said first ($V_{BE100}$) and said second ($V_{BE101}$) offset signals respectively.

4. A precision isolation amplifier circuit having a pair of input terminals (T, R) and an output terminal ($V_{T-R}$), for producing an output signal on said output terminal ($V_{T-R}$) representing the difference between the input signals ($V_T$, $V_R$) appearing on said pair of input terminals (T, R) comprising:

first (100, 102, 103) and second (101, 104, 105) input means connected respectively to said first (T) and said second (R) input terminals and responsive to a first ($V_T$) and a second ($V_R$) voltage signal appearing on said first (T) and said second (R) input terminals respectively for generating a first ($V_T+V_{BE100}$) and a second ($V_R+V_{BE101}$) drive signal which respectively comprise said first voltage signal ($V_T$) plus a first offset signal ($V_{BE100}$) which is independent of said first voltage signal and a second voltage signal ($V_R$) plus a second offset signal ($V_{BE101}$) which is independent of said second voltage signal;

first (110-112) and second (113-115) up/down emitter follower means connected to said first (100, 102, 103) and said second (101, 104, 105) input means respectively for generating the inverse of said first offset signal ($V_{BE100}$) and said second offset signal ($V_{BE101}$) respectively;

wherein said first (110-112) and said second (113-115) up/down emitter follower means are responsive to said first ($V_T+V_{BE100}$) and said second ($V_R+V_{BE101}$) drive signals respectively for combining said generated inverse first ($V_{BE100}$) and second ($V_{BE101}$) offset signals respectively with said first and second drive signals to output said first ($V_T$) and said second ($V_R$) voltage signals respectively;

impedance means (116, 117) connected between said first (110-112) and said second (113-115) up/down emitter follower means and responsive to said first ($V_T$) and said second ($V_R$) voltage signals output therefrom for generating a different current ($I_D$) through said impedance means (116, 117) and said first (110-112) and said second (113-115) up/down emitter follower means which is proportional to the voltage difference ($V_T-V_R$) between said first ($V_T$) and second ($V_R$) voltage signals; and proportion means (118-121; 124) connected to said first (110-112) and said second (113-115) up/down emitter follower means and responsive to said difference current ($I_D$) for providing an output voltage which is proportional to said difference current ($I_D$) and to the difference between the two input voltages ($V_T-V_R$).

5. The invention of claim 4 wherein said first (100) and said second (101) input amplifier means comprise unity gain voltage amplifier means responsive to said first ($V_T$) and said second ($V_R$) voltage signals respectively for outputting said first ($V_T$) and said second ($V_R$) voltage signals respectively plus said first ($V_{BE100}$) and said second ($V_{BE101}$) offset signals respectively.

* * * * *